United States Patent
Han et al.

(10) Patent No.: US 7,795,139 B2
(45) Date of Patent: Sep. 14, 2010

(54) METHOD FOR MANUFACTURING SEMICONDUCTOR PACKAGE

(75) Inventors: Kwon Whan Han, Seoul (KR); Chang Jun Park, Gyeonggi-do (KR); Min Suk Suh, Seoul (KR); Seong Cheol Kim, Gyeongsangnam-do (KR); Sung Min Kim, Seoul (KR); Seung Taek Yang, Seoul (KR); Seung Hyun Lee, Gyeonggi-do (KR); Jong Hoon Kim, Gyeonggi-do (KR); Ha Na Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 108 days.

(21) Appl. No.: 11/777,388

(22) Filed: Jul. 13, 2007

(65) Prior Publication Data

US 2008/0318361 A1 Dec. 25, 2008

(30) Foreign Application Priority Data

Jun. 20, 2007 (KR) ...................... 10-2007-0060263

(51) Int. Cl.
  *H01L 21/4763* (2006.01)
(52) U.S. Cl. ................ 438/639; 257/E23.067
(58) Field of Classification Search ............. 438/639, 438/369; 257/686, E23.067
  See application file for complete search history.

(56) References Cited

U.S. PATENT DOCUMENTS

| 6,583,030 B1 * | 6/2003 | Grassl ...................... 438/459 |
| 6,903,442 B2 | 6/2005 | Wood et al. |
| 7,074,703 B2 * | 7/2006 | Fukazawa ................. 438/598 |
| 7,446,404 B2 * | 11/2008 | Huang et al. ............... 257/686 |
| 2005/0046002 A1 | 3/2005 | Lee et al. |

FOREIGN PATENT DOCUMENTS

KR  1020050021078  3/2005

* cited by examiner

*Primary Examiner*—David A Zarneke
*Assistant Examiner*—Jenny L Wagner
(74) *Attorney, Agent, or Firm*—Ladas & Parry LLP

(57) ABSTRACT

A method for manufacturing a semiconductor package includes forming a groove in the portion outside of the bonding pad of a semiconductor chip provided with the bonding pad on an upper surface thereof; forming an insulation layer on the side wall of the groove; forming a metal layer over the semiconductor chip so as to fill the groove formed with the insulation layer; etching the metal layer to simultaneously form a through silicon via for filling the groove and a distribution layer for connecting the through silicon via and the bonding pad; and removing a rear surface of the semiconductor chip such that the lower surface of the through silicon via protrudes from the semiconductor chip.

18 Claims, 7 Drawing Sheets

METHOD FOR MANUFACTURING SEMICONDUCTOR PACKAGE

CROSS-REFERENCE TO RELATED APPLICATIONS

The present application claims priority to Korean patent application number 10-2007-0060263 filed on Jun. 20, 2007, which is incorporated herein by reference in its entirety.

BACKGROUND OF THE INVENTION

The present invention relates to a method for manufacturing a semiconductor package, and more particularly to a method for manufacturing a semiconductor package, which is capable of simplifying a process and reducing a manufacturing cost.

Packaging technologies for a semiconductor integrated device have been continuously developed to satisfy the demands for miniaturization and high capacity. Recently, various technologies for a stack type semiconductor package, which is capable of satisfying the demands for mounting efficiency as well as miniaturization and high capacity, have been developed.

The term "stack" in the semiconductor industry refers to a technology in which at least two semiconductor chips or packages are stacked in a vertical direction and, in the case of a memory device, it is possible to realize a product having a larger memory capacity than that which can be realized in a semiconductor integration process as well as an increased efficiency in usage of a mounting area.

The stack type semiconductor package can be manufactured largely by packaging stacked semiconductor chips together after stacking the semiconductor chips or by stacking semiconductor packages which are packaged separately. In the stack type semiconductor package, an electrical connection between a semiconductor chip and a substrate is made by a metal wire or a through silicon via.

Figure 1:
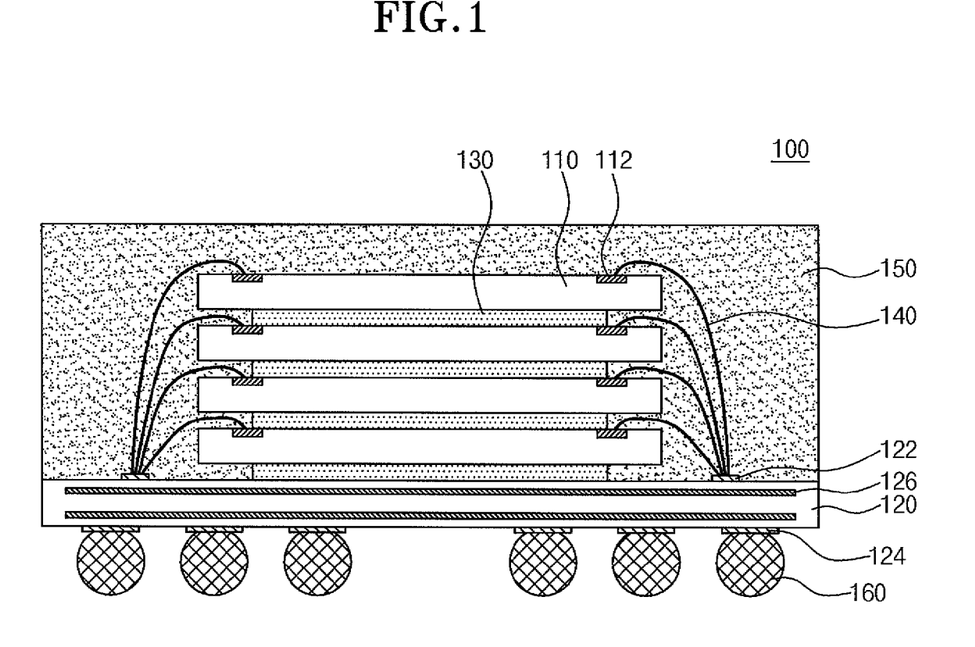
FIG. 1 is a cross-sectional view illustrating a conventional semiconductor package using a metal wire.

FIG. 1 is a cross-sectional view illustrating a conventional stack type semiconductor package using a metal wire.

As shown, a stack type semiconductor package 100 using a metal wire 140 has a structure in which at least two semiconductor chips 110 are stacked on a substrate 120 by an adhesive 130 and the bonding pad 112 of each semiconductor chip 110 and the connection terminal 122 of the substrate 120 are electrically connected through a metal wire 140.

In reference symbols which are not explained, 124 denotes a ball land, 126 denotes circuit wiring, 150 denotes an encapsulant and 160 denotes an outside connection terminal.

However, in the conventional stack type semiconductor package using metal wires, since an electrical signal exchange is transmitted through the metal wire, the high number of wires used results in a low speed and a deterioration in electrical properties. Further, the formation of the metal wires necessitates an additional area on the substrate thereby increasing the size of the package and the space required between the semiconductor chips for bonding the metal wires increases the height of the package.

Accordingly, in order to overcome the problems inherent in stack type semiconductor packages using metal wires, a stack type semiconductor package using a through silicon via (TSV) has been proposed.

Figure 2:
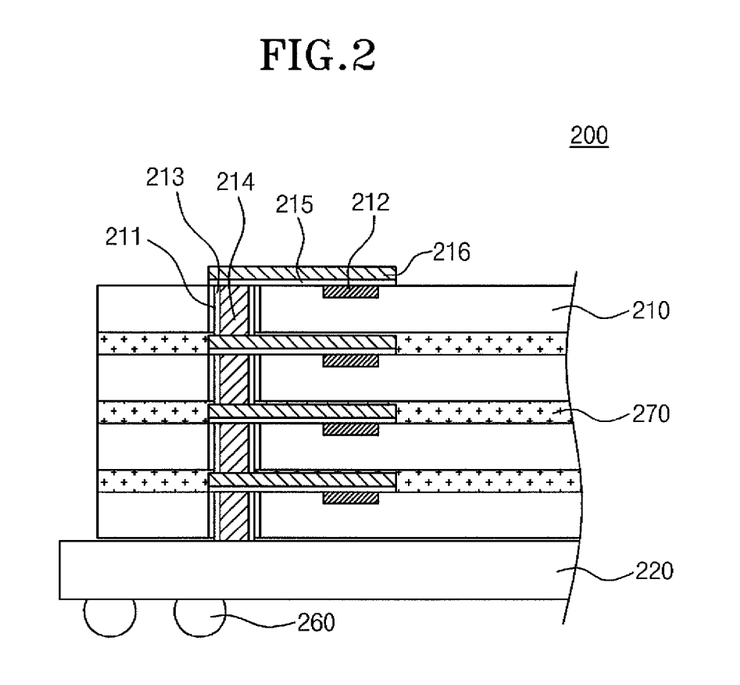
FIG. 2 is a cross-sectional view illustrating a conventional semiconductor package using a through silicon via.

FIG. 2 is a cross-sectional view illustrating a conventional stack type semiconductor package using a through silicon via.

As shown, a stack type semiconductor package 200 using a through silicon via 214 has a structure in which the through silicon via 214, a semiconductor chip 210 formed with a redistribution layer 216 connecting the through silicon via 214 and a bonding pad 212 are stacked such that the through silicon vias 214 are aligned.

The reference numeral 211 denotes an insulation layer; 220 denotes a substrate; 213 and 215 denote seed metal layers; 260 denotes an outside connection terminal; and 270 denotes a filler.

In the stack type semiconductor package 200 using a through silicon via, since an electrical connection is made through the through silicon via, a deterioration in electrical properties is prevented, thus increasing the operating speed of the semiconductor chip. Further, it is possible to miniaturize the stack type semiconductor package as an additional area on the substrate is removed and the distance between the stacked semiconductor chips is reduced.

However, the stack type semiconductor package using a through silicon via is characterized by a complicated process and an increased manufacturing cost because the process of forming the through silicon via and the process of forming the redistribution layer for connecting the bonding pad and the through silicon via are separately carried out.

BRIEF SUMMARY OF THE INVENTION

Embodiments of the present invention are directed to a method for manufacturing a semiconductor package which is capable of simplifying the process and reducing manufacturing costs.

In one embodiment, a method for manufacturing a semiconductor package comprises forming a groove in the portion of the semiconductor chip having a bonding pad at an upper surface thereof outside the bonding pad; forming an insulation layer at a side wall of the groove; forming a metal layer over the semiconductor chip so as to fill the groove formed with the insulation layer; etching the metal layer to form simultaneously a through silicon via for filling the groove and a distribution layer for connecting the through silicon via and the bonding pad; and removing the rear surface of the semiconductor chip so that the lower surface of the through silicon via protrudes from the semiconductor chip.

The method may further comprise forming mold parts on the upper and lower surfaces of the semiconductor chip so as to expose the upper and lower surfaces of the through silicon via after the step of removing the rear surface of the semiconductor chip.

The step of forming the metal layer includes depositing a seed metal layer over the semiconductor chip including the groove; plating the metal layer over the seed metal layer; and etching back the metal layer to reduce the thickness thereof.

The seed metal layer and the metal layer include any one of copper (Cu), aluminum (Al) and gold (Au) or an alloy respectively thereof.

The step of forming simultaneously the through silicon via and the distribution layer includes forming a mask over an area of the metal layer in which the through silicon via and the distribution layer is to be formed; etching the portion of the metal layer not covered by the mask; and removing the mask.

The etching of the metal layer is carried out in a wet etching process.

The step of removing the rear surface of the semiconductor chip is carried out in at least one of a grinding process and an etching process.

The steps of forming the groove through removing the rear surface of the semiconductor chip are carried out at the wafer level.

The method may further comprise sawing so as to separate the semiconductor chip at the chip level, after the step of removing the rear surface of the semiconductor chip at the wafer level.

In another embodiment, a method for manufacturing a semiconductor package may comprise forming a groove in the portion outside the bonding pad of a semiconductor chip provided with the bonding pad at an upper surface thereof; forming an insulation layer at a side wall of the groove; forming a metal layer over the semiconductor chip so as to fill the groove formed with the insulation layer; etching the metal layer to form simultaneously a through silicon via for filling the groove and a distribution layer for connecting the through silicon via and the bonding pad; removing the rear surface of the semiconductor chip so that the lower surface of the through silicon via protrudes from the semiconductor chip; and stacking at least two semiconductor chips having the through silicon via with the protruded lower surface such that the through silicon vias are connected to each other.

The method may further comprise forming mold parts on the upper and lower surfaces of the semiconductor chip so as to expose the upper and lower surfaces of the through silicon via, after the step of removing the rear surface of the semiconductor chip and before the step of stacking at least two semiconductor chips.

The step of forming the metal layer includes depositing a seed metal layer over the semiconductor chip including the groove; plating the metal layer over the seed metal layer; and etching back the metal layer to reduce the thickness thereof.

The seed metal layer and the metal layer include any one of copper (Cu), aluminum (Al) and gold (Au) or an alloy respectively thereof.

The step of simultaneously forming the through silicon via and the distribution layer includes forming a mask over the area on the metal layer where the through silicon via and the distribution layer is to be formed; etching the portion of the metal layer not covered by the mask; and removing the mask.

The etching of the metal layer is carried out in a wet etching process.

The step of removing the rear surface of the semiconductor chip is carried out in at least one of a grinding process and an etching process.

The steps of forming the groove through removing the rear surface of the semiconductor chip are carried out at the wafer level.

The method may further comprise sawing so as to separate the semiconductor chip at the chip level, after the step of removing the rear surface of the semiconductor chip at the wafer level.

The method may further comprise attaching the semiconductor chip onto a substrate; and attaching outside connection terminals to the lower surface of the substrate, after the step of removing the rear surface of the semiconductor chip.

The outside connection terminals are formed as solder balls.

DESCRIPTION OF SPECIFIC EMBODIMENTS

A preferred embodiment of the present invention is directed to a method for manufacturing a semiconductor package in which a through silicon via and a redistribution layer, connecting the through silicon via to a bonding pad, are formed simultaneously. Further, a preferred embodiment of the present invention is directed to a method for manufacturing a semiconductor package in which semiconductor chips are stacked vertically such that mold parts are formed on both upper and lower surfaces of the semiconductor chip formed with the through silicon via and the redistribution layer.

Therefore, in an embodiment of the present invention, since the through silicon via and the redistribution layer are formed not separately but simultaneously, it is possible to simplify the process and reduce manufacturing costs.

Also, in an embodiment of the present invention, because the stack type semiconductor package is realized by stacking the semiconductor chips formed with the mold parts on both the upper and lower surfaces thereof, it is possible to protect the semiconductor chips from mechanical shocks generated during the stacking process, thereby enhancing the reliability of the semiconductor package. Further, because the stack type semiconductor package is realized by stacking the semiconductor chips formed with the mold parts on both the upper and lower surfaces thereof, the manufacturing process is simplified since it is possible to omit an under-fill process which is traditionally required to fill the spaces between stacked semiconductor chips after the stacking of the semiconductor chips is completed.

Hereafter, a method for manufacturing a semiconductor package in accordance with an embodiment of the present invention will be described with reference to FIGS. 3A through 3E.

Figure 3A:
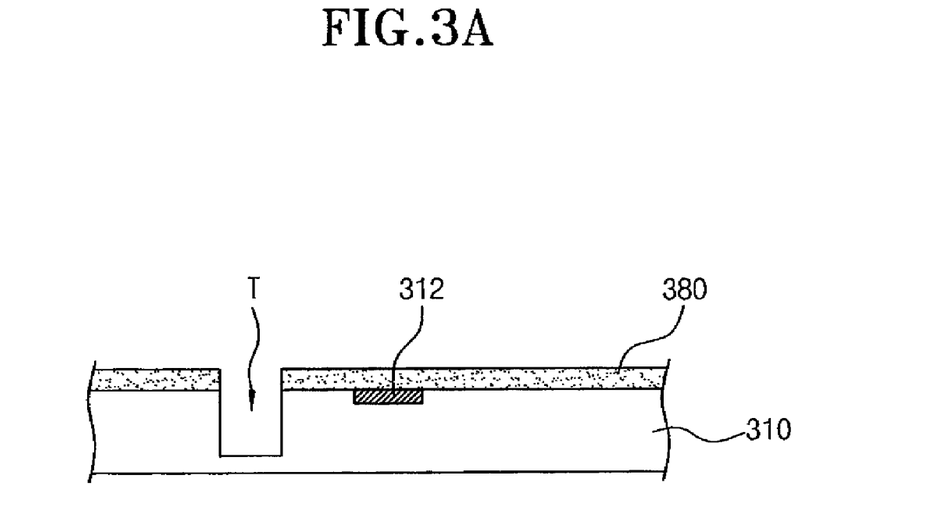
FIGS. 3A through 3E are cross-sectional views illustrating the process steps of a method for manufacturing a semiconductor package in accordance with an embodiment of the present invention.

Referring to FIG. 3A, a first mask pattern 380 for exposing a portion outside a bonding pad 312 corresponding to a through silicon via forming area is formed over an the upper surface of a semiconductor chip 310 having a plurality of bonding pads 312 on the upper surface thereof. Preferably, the first mask pattern 380 is comprised of a photoresist. Then, the exposed portion of the semiconductor chip 310 is etched to a depth at which the semiconductor chip 310 is not penetrated to form a groove T.

Figure 3B:
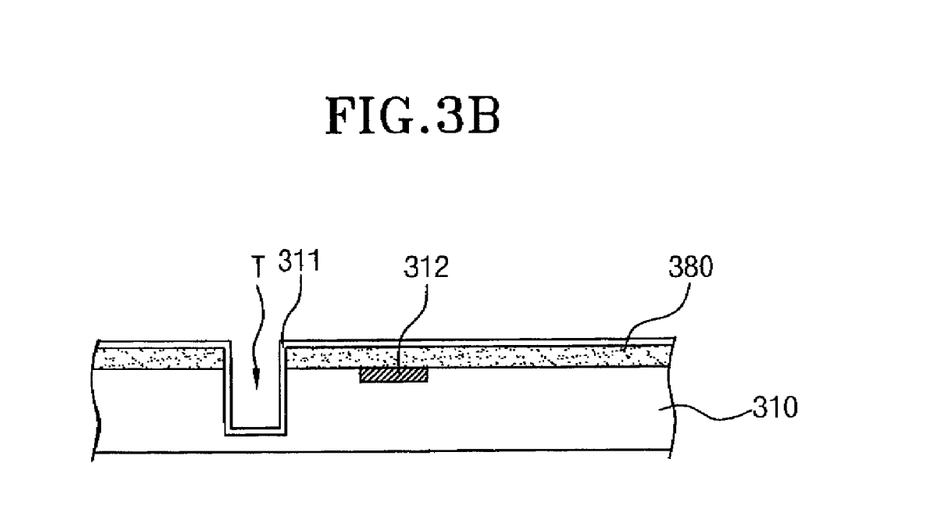

Referring to FIG. 3B, an insulation layer 311 is formed over the surface of the groove T and the first mask pattern 380 in order to insulate the semiconductor chip 310 and the through silicon via to be subsequently formed in the groove in the follow up process. The insulation layer 311 is etched back such that it covers only the side wall of the groove T.

Figure 3C:
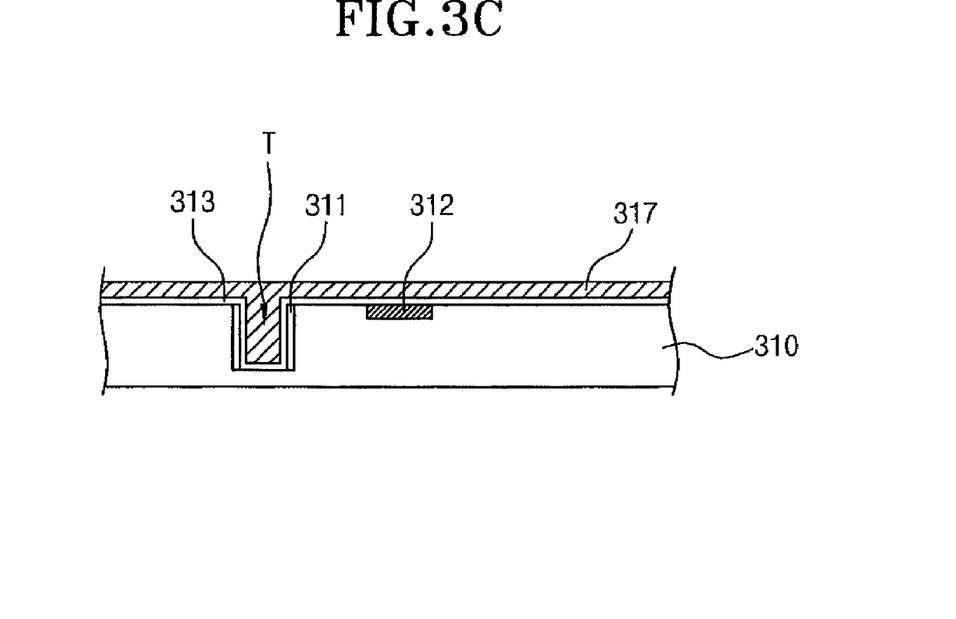

Referring to FIG. 3C, the first mask pattern is removed. Then, a seed metal layer 313 is formed over the surface of the groove T including the remaining insulation layer 311 and the semiconductor chip 310. A plating process is carried out to form a metal layer 317 over the seed metal layer 313 so as to fill the groove T. The seed metal layer 313 and the metal layer 317 include any one of copper (Cu), aluminum (Al) and gold (Au) or an alloy respectively thereof. In consideration of the overall thickness of the stack type semiconductor package to be manufactured, the metal layer 317 is etched back to reduce the thickness thereof.

Figure 3D:
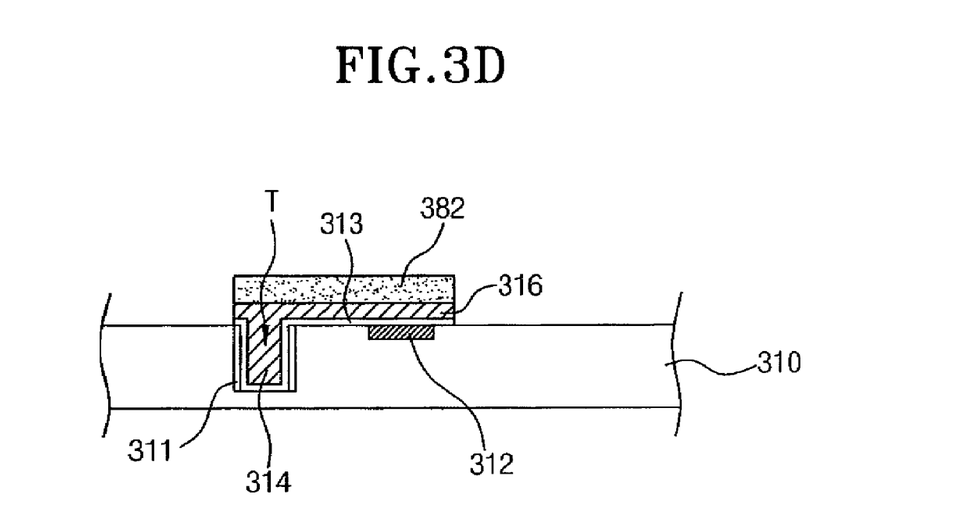

Referring to FIG. 3D, a second mask 382 for forming the through silicon via and the distribution layer for connecting the through silicon via to the bonding pad 312 is formed over the metal layer. Preferably, the second mask 382 is comprised of a photoresist and is formed, for example, so as to cover and area from the upper area of the groove T to the upper area of the bonding pad 312. The metal layer and the seed metal layer 313 below the metal layer are etched using the second mask pattern 382 as an etching mask, thereby forming the through silicon via 314 in the groove T as well as the distribution layer 316 for connecting the through silicon via 314 and the bonding pad 312. Herein, the through silicon via 314 and the distribution layer 316 are integrated and are formed simultaneously. The etching of the metal layer and the seed metal layer 313 is carried out in a wet etching process.

Figure 3E:
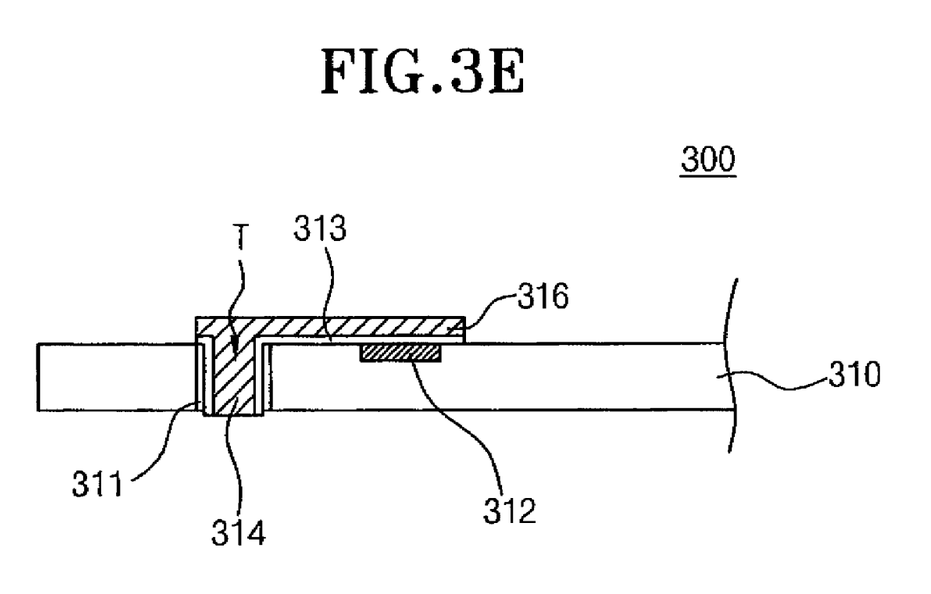

Referring to FIG. 3E, the second mask pattern is removed. Then, some thickness of the rear surface of the semiconductor chip 310 is removed so as to expose the through silicon via 314, thereby completing the manufacturing of the semiconductor package 300 provided with the integrated through silicon via 314 and distribution layer 316.

The removing of the semiconductor chip 310 is carried out with at least one of a grinding process and an etching process. For example, the removing of the semiconductor chip 310 may be carried out in a manner such that a back grinding process is implemented until the through silicon via 314 is exposed, the rear surface of the back ground semiconductor chip 310 is wet etched such that some of the lower surface of the silicon via 314 protrudes from the semiconductor chip 310.

The above described manufacturing of the semiconductor package in accordance with an embodiment of the present invention is preferably carried out at the wafer level and the manufactured wafer is divided at the chip level by a sawing process.

As described above, in an embodiment of the present invention, formation of the through silicon via and the distribution layer is carried out simultaneously in a single process, thereby simplifying the process and thus reducing manufacturing costs.

Meanwhile, at least two semiconductor packages manufactured by the above mentioned method are stacked such that their respective through silicon vias are connected to each other, thereby capable of constructing a stack type semiconductor package.

Figure 4:
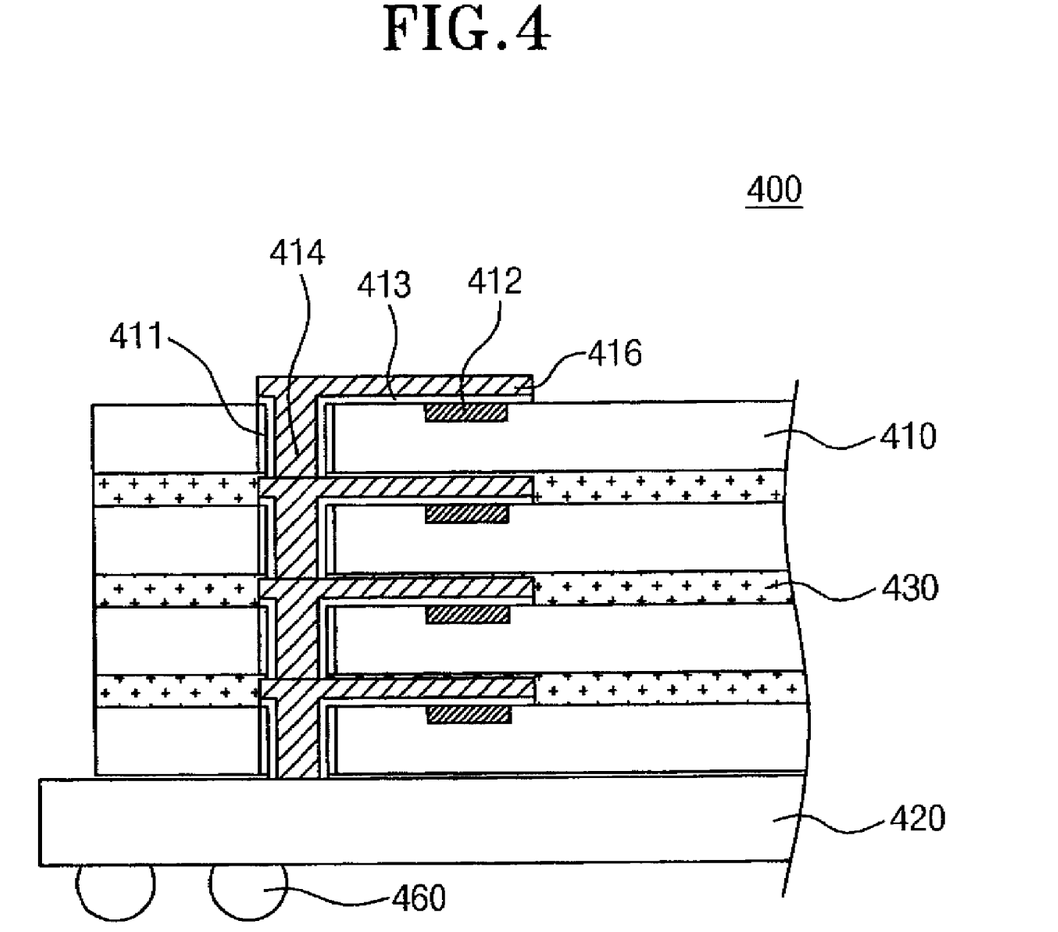
FIG. 4 is a cross-sectional view illustrating a stack type semiconductor package in accordance with another embodiment of the present invention.

FIG. 4 is a cross-sectional view illustrating a stack type semiconductor package in accordance with another embodiment of the present invention.

As shown, the stack type semiconductor package 400 has a structure in which at least two semiconductor chips 410 are stacked vertically such that their respective through silicon vias 414 are connected to each other, in other words, the through silicon via 414 of the upper semiconductor chip 410 is attached to the distribution layer 416 of the lower semiconductor chip 410.

A filler 430 is interposed between the stacked semiconductor chips 410 to improve the joint reliability and to protect the semiconductor chip 410. Further, the stacked semiconductor chips 410 are attached onto a substrate 420 and solder balls 460 are attached to the lower surface of the substrate 420 as outside connection terminals.

Meanwhile, though not shown, in order to protect the stacked semiconductor chips 410, an encapsulant may be formed over the substrate 420 so as to cover the stacked semiconductor chips 410. Alternatively, a capping layer may be formed over the uppermost stacked semiconductor chip 410.

Preferably, in the above mentioned stack type semiconductor package, stacking of the semiconductor chips and formation of the filler are carried out at the wafer level and then, after divided at the chip level through a sawing process, the stacked semiconductor chips are attached onto the substrate to complete the manufacture the stack type semiconductor package.

Meanwhile, because the semiconductor chips having the through silicon via and the distribution layer in accordance with the above-described embodiment of the present invention are slimmer, it is very susceptible to mechanical shocks generated during the stacking process for manufacturing a stack type semiconductor package. Further, it is necessary to employ a very difficult filling process in order to fill between the stacked semiconductor chips to manufacture the stack type semiconductor package.

Accordingly, in accordance with yet another embodiment of the present invention, in order to protect the semiconductor chip from the mechanical shock generated during the stacking process of the semiconductor chips and avoid the difficult filling process, a series of processes including the stacking of the semiconductor chip is carried out in a state in which molding parts are formed on the upper and lower surfaces of the semiconductor chip provided with the through silicon via and the distribution layer.

Figure 5A:
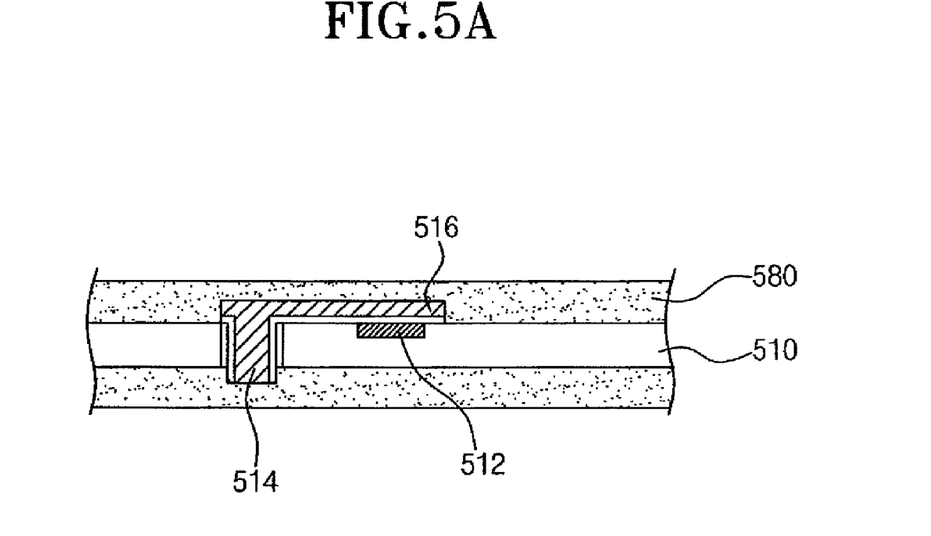
FIGS. 5A through 5C are cross-sectional views illustrating the process steps of a method for manufacturing a semiconductor package in accordance with yet another embodiment of the present invention.
Figure 5B:
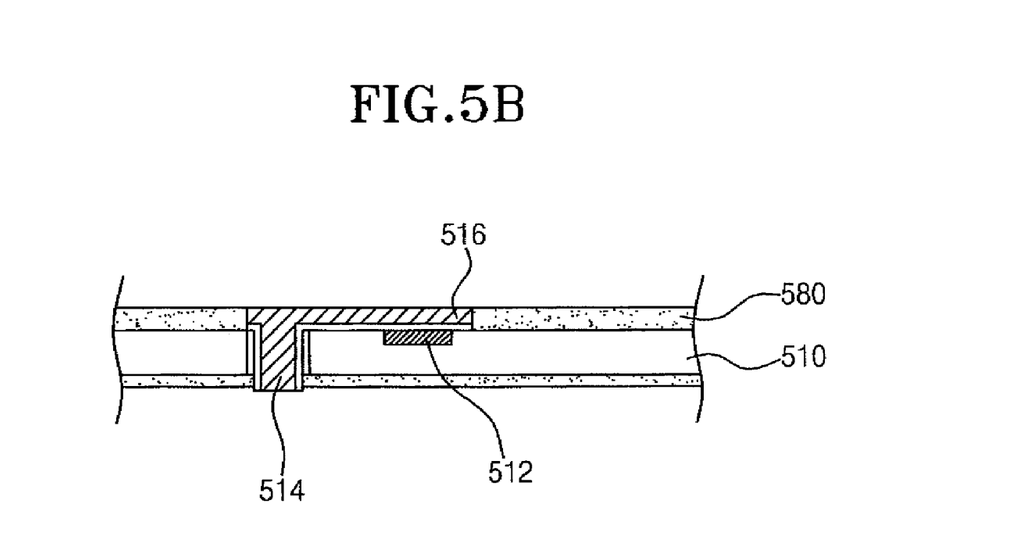
Figure 5C:
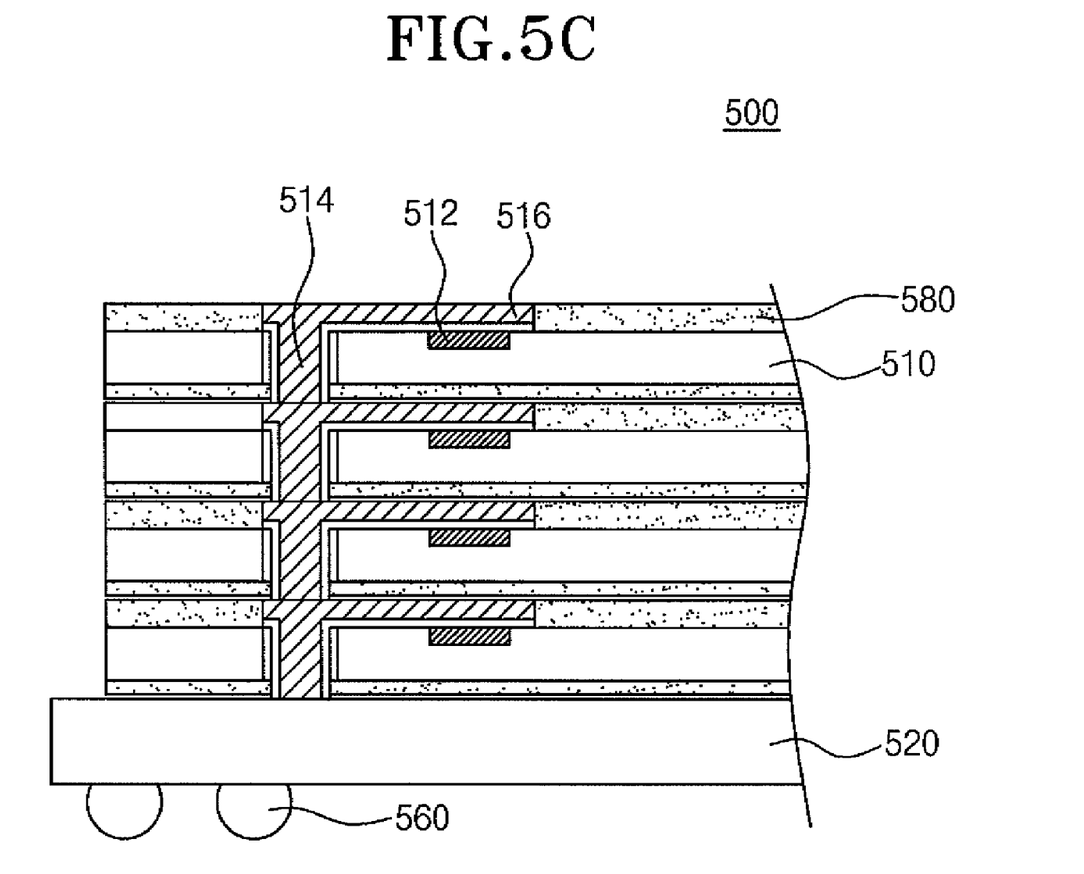

Particularly, FIGS. 5A through 5C are cross-sectional views illustrating the process steps of a method for manufacturing a semiconductor package in accordance with yet another an embodiment of the present invention.

Referring to FIG. 5A, on both the uppersurface and a lower surface of a semiconductor chip 510, which is provided with a bonding pad 512, is formed with a through silicon via 514 so that its lower surface protrudes to the outside of the bonding pad 512 and is formed with a distribution layer 516 for connecting the through silicon via 514 and the bonding pad 512 at the upper surface thereof, mold parts 580 are formed so as to cover the through silicon via 514 and the distribution layer 516.

Referring to FIG. 5B, the mold parts 580 formed on both the upper surface and the lower surface of the semiconductor chip 510 are subject to at least one of a grinding process and an etching process to expose the distribution layer 516 on the upper surface of the semiconductor chip 510 and the lower surface of the through silicon via 514 on the lower surface of the semiconductor chip 510.

Referring to FIG. 5C, at least two semiconductor chips 510 having a structure as depicted in FIG. 5B are stacked such that the through silicon vias 514 of each semiconductor chip 510 are connected to each other, in other words, the through silicon via 514 of the upper semiconductor chip 510 is attached to the distribution layer 516 of the lower semiconductor chip 510. After that, the stacked semiconductor chips 510 are attached onto a substrate 520 and solder balls 560 are attached to the lower surface of the substrate 520 as outside connection terminals, thereby manufacturing a stack type semiconductor package 500.

It is also possible to carry out the manufacturing of the stack type semiconductor package in accordance with this embodiment of the present invention at the wafer level. In this case, after the semiconductor chips stacked at the wafer level are separated at the chip level by performing a sawing process, the stacked semiconductor chips are attached onto the substrate to manufacture the stack type semiconductor package.

As is apparent from the above description, in an embodiment of the present invention, since the through silicon via and the distribution layer are formed not separately in separate processes but integratedly and simultaneously, it is possible to simplify the process and reduce manufacturing costs. In addition, in an embodiment of the present invention, since a stack type semiconductor package is manufactured such that mold parts are formed on both upper and lower surfaces of the semiconductor chip formed with a through silicon via and a redistribution layer, it is possible to protect the semiconductor chips from mechanical shocks generated during the stacking process and thus enhance the reliability of the semiconductor package. It is also possible to omit the filler forming process to thereby further simplify the manufacturing process.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor chip for packaging, comprising the steps of:
   forming a groove having a side wall on the upper surface of a semiconductor chip having a bonding pad on the upper surface thereof, wherein the bonding pad is formed adjacent to the groove so as to be spaced apart laterally from the groove, wherein the groove is closer to the outer perimeter of the semiconductor chip upper surface than the bonding pad;
   forming an insulation layer on the side wall of the groove;
   depositing a seed metal layer over the semiconductor chip including the groove formed with the insulation layer in the side wall;
   plating a metal layer over the seed metal layer so as to fill the groove with the metal layer and to cover at least a portion of the upper surface of the semiconductor chip including the bonding pad;
   removing a partial thickness of the metal layer over the groove and the upper surface of the semiconductor chip by etching back to reduce the overall thickness of the metal layer such that the metal layer remains covering at least a portion of the upper surface of the semiconductor chip including the bonding pad;
   simultaneously forming a through silicon via filled with metal in the groove and a distribution layer extending laterally on the upper surface of the semiconductor chip so as to connect the through silicon via to the bonding pad by patterning the etched back metal layer;
   removing a portion of the lower surface of the semiconductor chip to reduce the thickness thereof such that a part of the through silicon via at the bottom of the groove protrudes out of the lower surface of the semiconductor chip; and
   forming mold parts on the upper and lower surfaces of the semiconductor chip excluding the through silicon via so as to expose an entire upper surface of the distribution layer extending laterally so as to connect the through silicon via to the bonding pad and the bottom portion of the through silicon via such that the semiconductor chip is protected from mechanical shocks by the mold parts.

2. The method for manufacturing a semiconductor chip for packaging according to claim 1, wherein the step of forming mold parts on the upper and lower surfaces of the semiconductor chip comprises:
   after the step of removing a portion of the lower surface of the semiconductor chip to reduce the thickness thereof, forming mold parts on the upper and lower surfaces of the semiconductor chip so as to cover the distribution layer and the protruding part of the through silicon via, and then removing a portion of the mold part on the upper surface and removing a portion of the mold part on the lower surface to expose the distribution layer and the protruding part of the through silicon via.

3. The method for manufacturing a semiconductor chip for packaging according to claim 1, wherein each of the seed metal layer and the metal layer comprises any one of: copper (Cu), aluminum (Al), gold (Au), and an alloy repectively thereof.

4. The method for manufacturing a semiconductor chip for packaging according to claim 1, wherein the step of simultaneously forming the through silicon via and the distribution layer comprises the steps of:
   forming a mask over an area of the metal layer in which the through silicon via and the distribution layer are to be formed;
   etching the portion of the metal layer not covered by the mask; and
   after etching the portion of the metal layer not covered by the mask, removing the mask.

5. The method for manufacturing a semiconductor chip for packaging according to claim 4, wherein the etching of the metal layer is carried out in a wet etching process.

6. The method for manufacturing a semiconductor chip for packaging according to claim 1, wherein the step of removing the lower surface of the semiconductor chip is carried out in at least one of a grinding process and an etching process.

7. The method for manufacturing a semiconductor chip for packaging according to claim 1, wherein every step of claim 1 is performed to a semiconductor chip at a wafer level.

8. The method for manufacturing a semiconductor chip for packaging according to claim 7, further comprising the step of:
   after performing the step of removing a portion of the lower surface of the semiconductor chip, sawing the wafer so as to separate the semiconductor chip into a chip level.

9. A method for manufacturing a semiconductor package, comprising the steps of:
   providing a plurality of semiconductor chips, each of which is manufactured by the steps comprising:
   forming a groove having a side wall on the upper surface of a semiconductor chip having a bonding pad on the upper surface thereof, wherein the groove is closer to the outer perimeter of the semiconductor chip upper surface than the bonding pad;
   forming an insulation layer on the side wall of the groove;
   depositing a seed metal layer over the semiconductor chip including the groove formed with the insulation layer in the side wall;
   plating a metal layer over the seed metal layer so as to fill the groove with the metal layer and to cover at least a portion of the upper surface of the semiconductor chip including the bonding pad;
   removing a a partial thickness of the metal layer over the groove and the upper surface of the semiconductor chip by etching back to reduce the thickness of the metal layer such that the metal layer remains covering at least a portion of the upper surface of the semiconductor chip including the bonding pad;

simultaneously forming a through silicon via filled with metal in the groove and a distribution layer for connecting the through silicon via and the bonding pad by patterning the metal layer etched;

removing a portion of the lower surface of the semiconductor chip to reduce the thickness thereof such that a part of the through silicon via at the bottom of the groove protrudes out of the lower surface of the semiconductor chip;

forming mold parts on the upper and lower surfaces of the semiconductor chip excluding the through silicon via so as to expose the distribution layer and the bottom portion of the through silicon via such that the semiconductor chip is protected from mechanical shocks by the mold parts during subsequent stacking; and stacking two or more of the semiconductor chips having the mold parts formed thereon so that the through silicon vias from each of the stacked semiconductor chips are connected to each other while omitting any additional underfill process for filling space between adjacent semiconductor chips of the two or more stacked semiconductor chips.

10. The method for manufacturing a semiconductor package according to claim 9, wherein the step of forming mold parts on the upper and lower surface of the semiconductor chip comprises forming mold parts on the upper and lower surfaces of the semiconductor chip so as to cover the distribution layer and the protruding part of the through silicon via, and then removing a portion of the mold part on the upper surface and removing a portion of the mold part on the lower surface to expose the distribution layer and the protruding part of the through silicon via.

11. The method for manufacturing a semiconductor package according to claim 9, wherein each of the seed metal layer and the metal layer comprises any one of: copper (Cu), aluminum (Al), and gold (Au), and an alloy respectively thereof.

12. The method for manufacturing a semiconductor package according to claim 9, wherein the step of simultaneously forming the through silicon via and the distribution layer comprises the steps of:

forming a mask over an area of the metal layer in which the through silicon via and the distribution layer is to be formed;

etching the portion of the metal layer not covered by the mask; and after etching the portion of the metal layer not covered by the mask, removing the mask.

13. The method for manufacturing a semiconductor package according to claim 9, wherein the etching of the metal layer is carried out in a wet etching process.

14. The method for manufacturing a semiconductor package according to claim 9, wherein the step of removing the lower surface of the semiconductor chip is carried out in at least one of a grinding process and an etching process.

15. The method for manufacturing a semiconductor package according to claim 9, wherein every step of manufacturing each semiconductor chip as recited in claim 9 is performed to each one of the plurality of semiconductor chips at a wafer level.

16. The method for manufacturing a semiconductor package according to claim 15, further comprising the step of sawing the wafer so as to separate the plurality of semiconductor chips into a chip level.

17. The method for manufacturing a semiconductor package according to claim 9, further comprising the steps of:

attaching the semiconductor chip onto a substrate; and attaching outside connection terminals to a lower surface of the substrate.

18. The method for manufacturing a semiconductor package according to claim 17, wherein the outside connection terminals are formed as solder balls.

* * * * *